(12) United States Patent
Mine et al.

(10) Patent No.: US 12,532,707 B2
(45) Date of Patent: Jan. 20, 2026

(54) WAFER PLACEMENT TABLE (71) Applicant: NGK INSULATORS, LTD., Nagoya (JP)

(72) Inventors: Keita Mine, Chita-District (JP); Yohei Kajiura, Nagoya (JP); Keita Ikegami, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 119 days.

(21) Appl. No.: 18/627,572

(22) Filed: Apr. 5, 2024

(65) Prior Publication Data
US 2025/0087517 A1     Mar. 13, 2025

Related U.S. Application Data (63) Continuation of application No. PCT/JP2023/033244, filed on Sep. 12, 2023.

(51) Int. Cl.
*H01L 21/00* (2006.01)
*H01L 21/67* (2006.01)
*H01L 21/683* (2006.01)

(52) U.S. Cl.
CPC .... *H01L 21/6833* (2013.01); *H01L 21/67109* (2013.01)

(58) Field of Classification Search
CPC .................. H01L 21/67109; H01L 21/6833
See application file for complete search history.

(56) References Cited

U.S. PATENT DOCUMENTS

| | | | |
|---|---|---|---|
| 2001/0003901 A1* | 6/2001 | Bolandi | H01L 21/67109 62/3.3 |
| 2008/0178608 A1* | 7/2008 | Tandou | F25B 39/02 62/515 |

(Continued)

FOREIGN PATENT DOCUMENTS

| | | | |
|---|---|---|---|
| JP | 2021-028961 A | 2/2021 |
| JP | 2023-070860 A | 5/2023 |

(Continued)

OTHER PUBLICATIONS

International Search Report and Written Opinion (Application No. PCT/JP2023/033244) dated Nov. 14, 2023 (7 pages).

*Primary Examiner* — Eric S Ruppert
(74) *Attorney, Agent, or Firm* — BURR PATENT LAW, PLLC (57) ABSTRACT A wafer placement table includes a ceramic plate, a cooling plate and a refrigerant flow path. The refrigerant flow path has a first variable section and a second variable section. The first variable section is provided such that the cross-sectional area of the refrigerant flow path gradually decreases as it proceeds in the direction of refrigerant flow from a starting point of the first variable section. The second variable section is provided such that, after the cross-sectional area of the refrigerant flow path is once expanded from the cross-sectional area of the refrigerant flow path at an end point of the first variable section in a first expansion section right before a starting point of the second variable section, the cross-sectional area of the refrigerant flow path gradually decreases as it proceeds in the direction of refrigerant flow from the starting point of the second variable section.

7 Claims, 6 Drawing Sheets (56) References Cited

U.S. PATENT DOCUMENTS

| | | | |
|---|---|---|---|
| 2018/0218886 A1* | 8/2018 | Yamaguchi | H01L 21/67069 |
| 2021/0043476 A1 | 2/2021 | Koizumi et al. | |
| 2023/0087913 A1* | 3/2023 | Wang | H01L 21/6833 |
| | | | 165/53 |
| 2023/0144107 A1 | 5/2023 | Inoue et al. | |
| 2023/0146815 A1 | 5/2023 | Inoue et al. | |
| 2023/0238258 A1 | 7/2023 | Inoue et al. | |

FOREIGN PATENT DOCUMENTS

| | | |
|---|---|---|
| JP | 2023-070861 A | 5/2023 |
| JP | 2023-109671 A | 8/2023 |

* cited by examiner

WAFER PLACEMENT TABLE

BACKGROUND OF THE INVENTION

1. Field of the Invention

The present invention relates to a wafer placement table.

2. Description of the Related Art

A semiconductor manufacturing apparatus includes a wafer placement table, such as a ceramic heater for heating wafers and an electrostatic chuck for attracting and holding wafers. PTL 1 discloses a wafer placement table of this type that includes a ceramic plate having a wafer placement surface on its upper surface and including a built-in electrode and a cooling plate disposed on a lower surface of the ceramic plate. The cooling plate has an internal refrigerant flow path. The refrigerant flow path extends in a swirl shape from the inlet to the outlet in plan view. The cross-sectional area of the refrigerant flow path gradually decreases from the inlet to the outlet of the refrigerant flow path. The temperature of the refrigerant increases from the inlet to the outlet of the refrigerant flow path, and the velocity of the refrigerant increases from the inlet to the outlet of the refrigerant flow path. This improves the temperature uniformity of a wafer.

CITATION LIST

Patent Literature

PTL 1: Japanese Unexamined Patent Application Publication No. 2021-28961 (FIGS. 5 and 8)

SUMMARY OF THE INVENTION

However, a configuration in which the cross-sectional area of the refrigerant flow path gradually decreases from the inlet to the outlet of the refrigerant flow path may fail to sufficiently improve the temperature uniformity of the wafer.

The present invention was made to solve the above-described problem, and the main object thereof is to increase the temperature uniformity of a wafer.

[1] A wafer placement table of the present invention includes: a ceramic plate having a wafer placement surface on its surface and including a built-in electrode; a cooling plate disposed on a lower surface of the ceramic plate; and a refrigerant flow path extending in the cooling plate, having an inlet located at one of an outer peripheral side and a center side of the cooling plate and an outlet located on the other of the outer peripheral side and the center side of the cooling plate, and extending from the inlet to the outlet in a swirl shape in plan view, wherein the refrigerant flow path has a first variable section extending from the inlet as a starting point and a second variable section located downstream of the first variable section, the first variable section is provided such that a cross-sectional area of the refrigerant flow path gradually decreases as it proceeds in the direction of refrigerant flow from the starting point of the first variable section, and the second variable section is provided such that, after the cross-sectional area of the refrigerant flow path is once expanded from the cross-sectional area of the refrigerant flow path at an end point of the first variable section in a first expansion section right before the starting point of the second variable section, the cross-sectional area of the refrigerant flow path gradually decreases as it proceeds in the direction of refrigerant flow from the starting point of the second variable section.

In the wafer placement table, the first variable section is provided such that the cross-sectional area of the refrigerant flow path gradually decreases (in other words, the velocity of the refrigerant gradually increases) as it proceeds in the direction of refrigerant flow from the starting point of the first variable section. In the first variable section of the refrigerant flow path, the temperature of the refrigerant becomes lower toward the upstream side and higher toward the downstream side, and the velocity of the refrigerant becomes lower toward the upstream side and higher toward the downstream side (in other words, the heat exchange efficiency (cooling efficiency) of the refrigerant decreases toward the upstream side and increases toward the downstream side). This reduces difference in heat extraction performance of the refrigerant between the upstream side and the downstream side of the first variable section. The second variable section is provided such that, after the cross-sectional area of the refrigerant flow path is once expanded from the cross-sectional area of the refrigerant flow path at an end point of the first variable section in a first expansion section right before the starting point of the second variable section, the cross-sectional area of the refrigerant flow path gradually decreases as it proceeds in the direction of refrigerant flow from the starting point of the second variable section. The difference in heat extraction performance of the refrigerant between the upstream side and the downstream side of the second variable section is small for the same reason as in the first variable section. In particular, in the second variable section, since the cross-sectional area of the refrigerant flow path is once expanded right before the starting point of the second variable section, the difference in cross-sectional area between the upstream side and the downstream side of the second variable section can be made large with the pressure loss of the refrigerant flowing in the second variable section being kept low. With this configuration, the wafer can have higher temperature uniformity.

[2] In the wafer placement table according to the present invention (the wafer placement table according to the above [1]), the first expansion section may be shorter than the first variable section. With this configuration, the first variable section can be long.

[3] In the wafer placement table according to the present invention (the wafer placement table according to the above [1] or [2]), the end point of the first variable section may be located near the point where the first variable section has made one round along the refrigerant flow path from the starting point of the first variable section. With this configuration, the amount of heat extraction by a refrigerant can be made substantially uniform in the refrigerant flow path over almost the entire one round including the first variable section.

The phrase "near the point where the first variable section has made one round" may refer to the point where the first variable section has made one round, the point where the first variable section has made 0.8 to 1 round, or the point where the first variable section has made 1 to 1.2 round.

[4] In the wafer placement table according to the present invention (the wafer placement table according to any one of the above [1] to [3]), the end point of the first variable section may coincide with the starting point of the first expansion section. With this configuration, the end of the first variable section can directly continue to the first expansion section.

[5] In the wafer placement table according to the present invention (the wafer placement table according to any one of the above [1] to [4]), the first expansion section may be a non-arc-shaped (e.g., linear) section disposed in the way of the circumferential portion of the swirl shape of the refrigerant flow path. With this configuration, in the non-arc-shaped section disposed in the way of the circumferential portion, the velocity distribution of the refrigerant changes, and thus the cross-sectional area of the refrigerant flow path can be increased in a relatively short distance by using this section.

[6] In the wafer placement table according to the present invention (the wafer placement table according to any one of the above [1] to [5]), a distance between a ceiling surface of the refrigerant flow path and the wafer placement surface may be constant from the inlet to the outlet of the refrigerant flow path, and the cross-sectional area of the refrigerant flow path may be varied by varying a width of the refrigerant flow path with a height of the refrigerant flow path in cross-section being kept constant. In this configuration, the cross-sectional area of the refrigerant flow path can be varied by varying a width of the refrigerant flow path with a distance between a ceiling surface of the refrigerant flow path and a wafer placement surface being kept constant and a height of the refrigerant flow path in cross-section being kept constant, enabling the wafer placement table of the present invention to be relatively readily produced.

[7] In the wafer placement table according to the present invention (the wafer placement table according to any one of the above [1] to [6]), the refrigerant flow path may have a third variable section located downstream of the second variable section, and the third variable section is provided such that, after the cross-sectional area of the refrigerant flow path is once expanded from the cross-sectional area of the refrigerant flow path at an end point of the second variable section in a second expansion section right before the starting point of the third variable section, the cross-sectional area of the refrigerant flow path gradually decreases as it proceeds in the direction of refrigerant flow from the starting point of the third variable section. With this configuration, the presence of the additional third variable section can further improve the heat uniformity of the wafer.

DETAILED DESCRIPTION OF THE INVENTION

Figure 1:
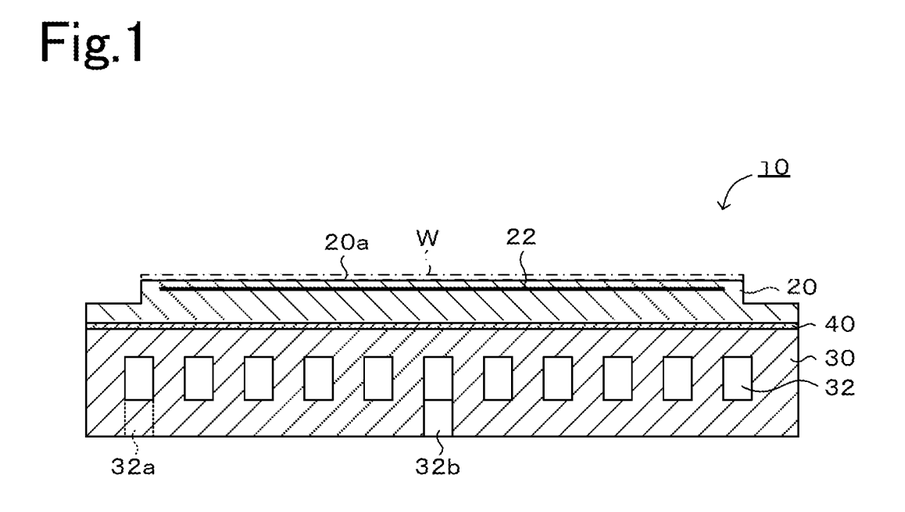
FIG. 1 is a cross-sectional view illustrating a schematic configuration of a wafer placement table 10.
Figure 2:
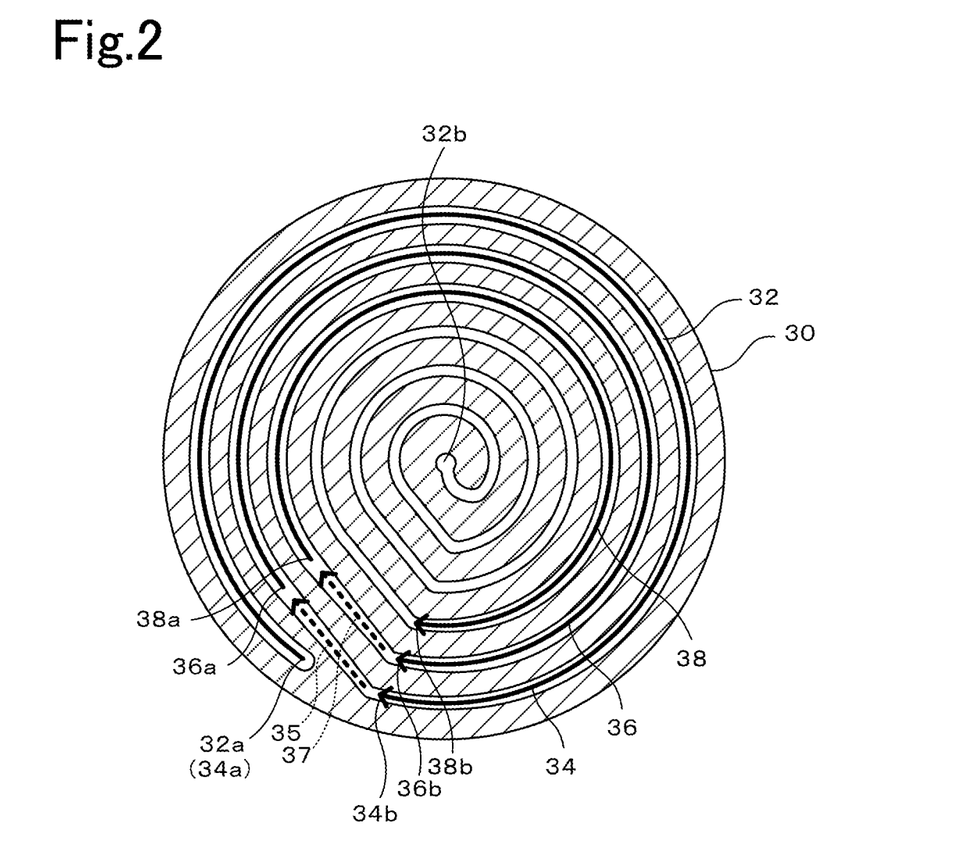
FIG. 2 is a plan view of a refrigerant flow path 32.

FIG. 1 is a cross-sectional view illustrating a schematic configuration of a wafer placement table 10 according to this embodiment (cross-sectional view of the wafer placement table 10 taken along the plane including the central axis of the wafer placement table 10). FIG. 2 is a plan view of the refrigerant flow path 32 (cross-sectional view of the cooling plate 30 taken along the horizontal plane passing through the refrigerant flow path 32 and viewed from above). In the following description, terms such as up and down, left and right, and front and back may be used, but such terms indicate only relative positional relationships.

The wafer placement table 10 is an example of a member for semiconductor manufacturing apparatus used to process wafers W. As illustrated in FIG. 1, the wafer placement table 10 includes a ceramic plate 20, a cooling plate 30, and a bonding layer 40.

The ceramic plate 20 is a stepped disc-shaped member and has a wafer placement surface 20a on its upper surface. For example, the diameter of the upper portion of the ceramic plate 20 is 300 mm, the diameter of the lower portion is 340 mm, and the diameter of the wafer W is about 300 mm. The ceramic plate 20 is formed of a ceramic-containing material. The ceramic-containing material contains a ceramic as a main component and may contain, in addition to the ceramic, components derived from sintering aids (e.g., rare earth elements) and inevitable components. The "main component" accounts for greater than or equal to 50 mass % of the total. The ceramic may be, for example, alumina or aluminum nitride.

An electrostatic electrode 22 is buried in the upper portion of the ceramic plate 20. The electrostatic electrode 22 is formed of a material containing a metal, such as W, Mo, WC, or MoC. The metal forming the electrostatic electrode 22 preferably has a coefficient of thermal expansion close to that of the ceramic plate 20. The electrostatic electrode 22 may contain the ceramic contained in the ceramic plate 20 so that the coefficient of thermal expansion of the electrostatic electrode 22 becomes closer to that of the ceramic plate 20. The electrostatic electrode 22 is a disc-shaped or mesh-patterned unipolar electrostatic electrode. The layer of the ceramic plate 20 above the electrostatic electrode 22 serves as a dielectric layer. A DC power supply for electrostatic attraction (not illustrated) is coupled to the electrostatic electrode 22 via a power feeder.

The cooling plate 30 is a disc-shaped member internally having a refrigerant flow path 32 through which a refrigerant can circulate. The diameter of the cooling plate 30 is the same as that of the lower portion of the ceramic plate 20. The refrigerant flowing through the refrigerant flow path 32 is preferably liquid and preferably has electrical insulating properties. Examples of the electrically insulating liquid include a fluorinated inert liquid. The cooling plate 30 is formed, for example, of a conductive material containing metal. Examples of the conductive material include metals and composite materials. Examples of the metals include Al, Ti, Mo, and alloys of them. Examples of the composite materials include metal matrix composites (MMC) and ceramic matrix composites (CMC). Specific examples of the composite materials include a material containing Si, SiC, and Ti and a material containing a SiC porous body impregnated with Al and/or Si. The material containing Si, SiC, and Ti is called SiSiCTi, the porous SiC material impregnated with Al is called AlSiC, and the porous SiC material impregnated with Si is called SiSiC. The material of the cooling plate 30 is preferably a material having a coefficient of thermal expansion close to that of the material of the ceramic plate 20. The cooling plate 30 may also be used as an RF electrode.

As illustrated in FIG. 2, the refrigerant flow path 32 extends over the entire area of the ceramic plate 20 in plan view. The refrigerant flow path 32 extends in a swirl shape from an inlet 32a located on an outer peripheral side of the cooling plate 30 to an outlet 32b located on a center side of the cooling plate 30. The refrigerant flow path 32 in this embodiment are based on multiple concentric circular channels having different diameters (six channels in this embodiment) and are formed in a swirl shape by connecting the adjacent outer circular channels and inner circular channels with linear channels. The inlet 32a is an end of the refrigerant flow path 32 located at the outer peripheral side of the cooling plate 30 and opens in the lower surface of the cooling plate 30. The outlet 32b is the other end of the refrigerant flow path 32 located at the center side of the cooling plate 30 and opens in the lower surface of the cooling plate 30. The inlet 32a and the outlet 32b of the refrigerant flow path 32 are connected to a refrigerant circulation pump (not illustrated) that controls the temperature of the refrigerant. The refrigerant flow path 32 includes a first variable section 34, a second variable section 36, and a third variable section 38.

The first variable section 34 is the outermost arc-shaped portion of the swirl refrigerant flow path 32 (indicated by a solid arc-shaped arrow in FIG. 2). The first variable section 34 extends almost the entire one round from a starting point 34a (inlet 32a) to an end point 34b in the direction of refrigerant flow. The end point 34b of the first variable section 34 is located near the point where the first variable section 34 has made one round along the refrigerant flow path 32 (e.g., located at the point where the first variable section 32 has made 0.8 to 1 round) from the starting point 34a of the first variable section 34. In the first variable section 34, the cross-sectional area of the refrigerant flow path 32 gradually decreases as it proceeds in the direction of refrigerant flow from the starting point 34a. The cross-sectional area of the refrigerant flow path 32 is the area of the refrigerant flow path 32 in cross-section taken in a direction perpendicular to the upper surface of the cooling plate 30 and orthogonal to the refrigerant flow (the same applies hereinafter). In this embodiment, the refrigerant flow path 32 has a rectangular cross-section. The distance between the ceiling surface of the refrigerant flow path 32 and the wafer placement surface 20a is constant from the inlet 32a to the outlet 32b of the refrigerant flow path 32. The cross-sectional area of the refrigerant flow path 32 is varied by varying the width of the refrigerant flow path 32 with the height in cross-section being kept constant. For example, the width of the first variable section 34 is 8 mm at the starting point 34a and gradually decreases in the direction of refrigerant flow so that it becomes 6 mm at the end point 34b.

The second variable section 36 is the second outermost arc-shaped portion (indicated by a solid arc-shaped arrow in FIG. 2) of the swirl refrigerant flow path 32. The second variable section 36 extends almost the entire one round from a starting point 36a to an end point 36b in the direction of the refrigerant flow. The end point 36b of the second variable section 36 is located near the point where the second variable section 36 has made one round along the refrigerant flow path 32 (e.g., located at the point where the second variable section 36 has made 0.8 to 1 round) from the starting point 36a of the second variable section 36. A first expansion section 35 is present right before the starting point 36a of the second variable section 36. The first expansion section 35 is located between the end point 34b of the first variable section 34 and the starting point 36a of the second variable section 36. The first expansion section 35 is shorter than the first and second variable sections 34 and 36. The first expansion section 35 is a linear switching section (indicated by a dotted linear arrow in FIG. 2) between the outermost arc of the refrigerant flow path 32 and the second outermost arc. In the first expansion section 35, the cross-sectional area of the refrigerant flow path 32 increases from the end point 34b of the first variable section 34 to the starting point 36a of the second variable section 36. Specifically, in the first expansion section 35, with the height of the refrigerant flow path 32 in cross-section being kept constant, the width of the refrigerant flow path 32 at the end point 34b of the first variable section 34 gradually increases toward the starting point 36a of the second variable section 36. For example, the width of the refrigerant flow path 32 is 6 mm at the end point 34b of the first variable section 34 and gradually increases so that it becomes 8 mm at the starting point 36a of the second variable section 36.

In the second variable section 36, the cross-sectional area of the refrigerant flow path 32 gradually decreases as it proceeds in the direction of refrigerant flow from the starting point 36a. Also in this section, the cross-sectional area of the refrigerant flow path 32 is varied by varying the width of the refrigerant flow path 32 with the height in cross-section being kept constant. For example, the width of the second variable section 36 is 8 mm at the starting point 36a and gradually decreases in the direction of refrigerant flow so that it becomes 6 mm at the end point 36b.

The third variable section 38 is the third outermost arc-shaped portion (indicated by a solid arc-shaped arrow in FIG. 2) of the swirl refrigerant flow path 32. The third variable section 38 extends almost the entire one round from a starting point 38a to an end point 38b in the direction of the refrigerant flow. The end point 38b of the third variable section 38 is located near the point where the third variable section 38 has made one round along the refrigerant flow path 32 (e.g., located at the point where the third variable section 38 has made 0.8 to 1 round) from the starting point 38a of the third variable section 38. A second expansion section 37 is present right before the starting point 38a of the third variable section 38. The second expansion section 37 is located between the end point 36b of the second variable section 36 and the starting point 38a of the third variable section 38. The second expansion section 37 is shorter than the second and third variable sections 36 and 38. The second expansion section 37 is a linear switching section (indicated by a dotted linear arrow in FIG. 2) between the second outermost arc of the refrigerant flow path 32 and the third outermost arc. In the second expansion section 37, the cross-sectional area of the refrigerant flow path 32 increases from the end point 36b of the second variable section 36 to the starting point 38a of the third variable section 38. Specifically, in the second expansion section 37, the width of the refrigerant flow path 32 at the end point 36b of the second variable section 36 gradually increases toward the starting point 38a of the third variable section 38. For example, the width of the refrigerant flow path 32 is 6 mm at the end point 36b of the second variable section 36 and gradually increases so that it becomes 8 mm at the starting point 38a of the third variable section 38.

In the third variable section 38, the cross-sectional area of the refrigerant flow path 32 gradually decreases as it proceeds in the direction of refrigerant flow from the starting point 38a. Also in this section, the cross-sectional area of the refrigerant flow path 32 is varied by varying the width of the refrigerant flow path 32 with the height in cross-section being kept constant. For example, the width of the third variable section 38 is 8 mm at the starting point 38a and gradually decreases in the direction of refrigerant flow so that it becomes 6 mm at the end point 38b. The refrigerant flow path 32 has a constant cross-sectional area (constant height and width in cross-section) from the end point 38b of the third variable section 38 to the outlet 32b of the refrigerant flow path 32.

The bonding layer 40 bonds the lower surface of the ceramic plate 20 and the upper surface of the cooling plate 30 to each other. The bonding layer 40 may be a metal bonding layer formed of solder or a metal brazing material, for example. The metal bonding layer may be formed by TCB (Thermal Compression Bonding), for example. TCB is a widely-known method in which a metal bonding material is sandwiched between two bonding target members and the two members heated to a temperature below or equal to the solidus line temperature of the metal bonding material are pressure-bonded. An organic adhesive layer may be employed as the bonding layer 40 instead of the metal bonding layer.

Next, a usage example of the wafer placement table 10 will be described. First, the wafer placement table 10 is disposed in a vacuum chamber (not illustrated), and then a wafer W is placed on the wafer placement surface 20a of the wafer placement table 10. Then, a DC power supply (not illustrated) applies a voltage to the electrostatic electrode 22. This allows the wafer W to be attracted and fixed to the wafer placement surface 20a. Then, the inside of the vacuum chamber is made to have a vacuum atmosphere or a reduced-pressure atmosphere, and the wafer W is processed in the vacuum chamber. For example, the wafer W may be treated with plasma. In such a case, a top electrode having a shower head is placed on the ceiling of the vacuum chamber, and, while reaction gas is supplied from the shower head to the space between the wafer W and the top electrode, a high-frequency voltage is applied between the top electrode and the cooling plate 30 to generate plasma. After the processing of the wafer W, the application of voltage to the electrostatic electrode 22 is stopped. This stops the attraction-fixation of the wafer W to the wafer placement surface 20a.

During use of the wafer placement table 10, a refrigerant is fed to the refrigerant flow path 32 when the wafer W needs to be cooled. The refrigerant moves through the refrigerant flow path 32 from the inlet 32a to the outlet 32b while drawing heat away from the wafer W. Thus, the temperature of the refrigerant is lowest at the inlet 32a and highest at the outlet 32b of the refrigerant flow path 32.

In the first variable section 34 of the refrigerant flow path 32, the temperature of the refrigerant is lowest at the starting point 34a and highest at the end point 34b, and the velocity of the refrigerant is lowest at the starting point 34a and highest at the end point 34b. This reduces difference in heat extraction performance of the refrigerant between the starting point 34a and the end point 34b of the first variable section 34.

The cross-sectional area of the refrigerant flow path 32 increases in the first expansion section 35 from the cross-sectional area at the end point 34b of the first variable section 34, and then the cross-sectional area of the refrigerant flow path 32 gradually decreases in the second variable section 36 of the refrigerant flow path 32 with distance from the starting point 36a of the second variable section 36 in the direction of refrigerant flow. In the second variable section 36, the temperature of the refrigerant is lowest at the starting point 36a and highest at the end point 36b, and the velocity of the refrigerant is lowest at the starting point 36a and highest at the end point 36b. This reduces difference in heat extraction performance of the refrigerant between the starting point 36a and the end point 36b of the second variable section 36.

The cross-sectional area of the refrigerant flow path 32 increases in the second expansion section 37 from the cross-sectional area at the end point 36b of the second variable section 36, and then the cross-sectional area of the refrigerant flow path 32 gradually decreases in the third variable section 38 of the refrigerant flow path 32 with distance from the starting point 38a of the third variable section 38 in the direction of refrigerant flow. In the third variable section 38, the temperature of the refrigerant is lowest at the starting point 38a and highest at the end point 38b, and the velocity of the refrigerant is lowest at the starting point 38a and highest at the end point 38b. This reduces difference in heat extraction performance of the refrigerant between the starting point 38a and the end point 38b of the third variable section 38.

Here, as Example, the refrigerant flow path 32 of the wafer placement table 10 has the first variable section 34 (height is 15 mm (constant) and width gradually changes from 8 mm to 6 mm in cross-section), the first expansion section 35 (height is 15 mm (constant) and width increases from 6 mm to 8 mm in cross-section), the second variable section 36 (height is 15 mm (constant) and width gradually changes from 8 mm to 6 mm in cross-section), the second expansion section 37 (height is 15 mm (constant) and width increases from 6 mm to 8 mm in cross-section), and the third variable section 38 (height is 15 mm (constant) and width gradually changes from 8 mm to 6 mm in cross-section). The section from the end of the third variable section 38 to the outlet 32b has a height of 15 mm (constant) and a width of 6 mm (constant) in cross-section. In contrast, as Comparative Example, a refrigerant flow path 32 of the wafer placement table 10 has a height of 15 mm (constant) and a width of 6 mm (constant) in cross-section from the inlet 32a to the outlet 32b. Then, the temperature distribution of the wafer placement surface 20a in a steady state is examined for Example and Comparative Example under the conditions that the heat input to the wafer placement surface 20a is 50,000 W/cm$^2$ and a −10° C. refrigerant is supplied to the refrigerant flow path 32 at a constant amount. As a result, the temperature difference ΔT (difference between the maximum temperature and the minimum temperature) in the wafer placement surface 20a was 5° C. in Comparative Example and 1° C. in Example. This result showed that Example can improve the heat uniformity of wafers more than Comparative Example.

Next, an example of a process of producing the wafer placement table 10 will be described. The example of the process of producing the ceramic plate 20 is well known. Here, an example of a process of producing the cooling plate 30 will be described. FIGS. 3A to 3D illustrate steps of producing the cooling plate 30.

Figure 3A:
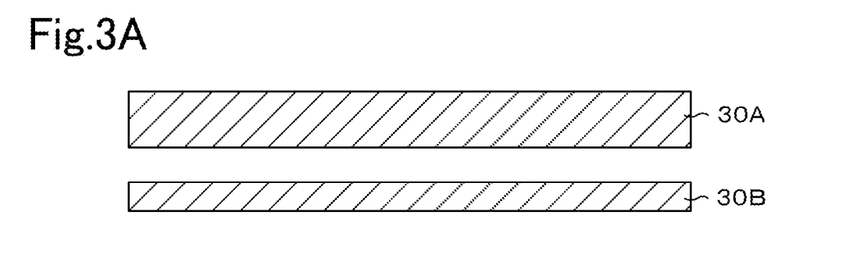
FIGS. 3A to 3D illustrate steps of producing a cooling plate 30.
Figure 3B:
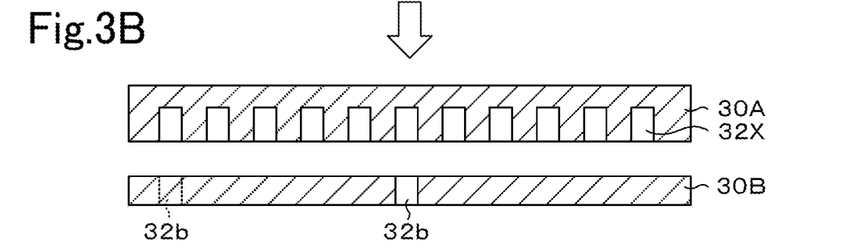

First, an upper disc-shaped member 30A and a lower disc-shaped member 30B each formed of a conductive material are produced (FIG. 3A). Then, a vertical through hole is formed in the lower disc-shaped member 30B at each of the outer peripheral side and the center side, and a refrigerant flow path groove 32X is formed in the lower surface of the upper disc-shaped member 30A (FIG. 3B). The hole at the outer peripheral side of the lower disc-shaped member 30B becomes the inlet 32a of the refrigerant flow path 32, and the hole at the center side becomes the outlet 32b of the refrigerant flow path 32. The refrigerant flow path groove 32X formed in the upper disc-shaped member 30A has the same shape as the refrigerant flow path 32 in plan view and has a constant depth over the entire length of the refrigerant flow path groove 32X. In other words, the refrigerant flow path groove 32X has a constant depth and a width that varies depending on the positions. Thus, the refrigerant flow path groove 32X can be formed more easily than a groove having a depth that varies depending on the positions.

Figure 3C:
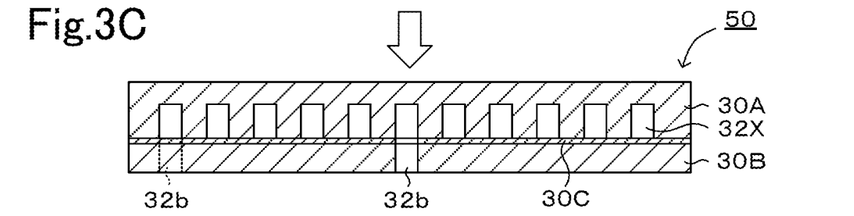
Figure 3D:
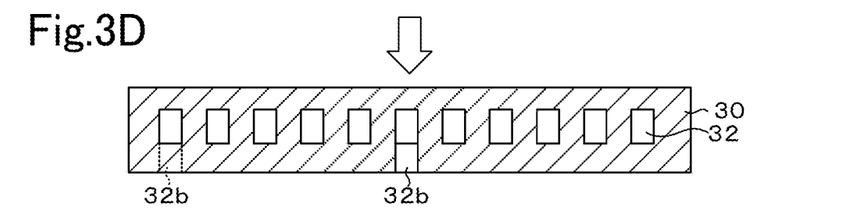

Next, a metal bonding member 30C is placed between the upper surface of the lower disc-shaped member 30B and the lower surface of the upper disc-shaped member 30A to form a stack 50 (FIG. 3C). In this step, the outer-peripheral-side end of the refrigerant flow path groove 32X is made to coincide with the inlet 32a of the refrigerant flow path 32, and the center-side end of the refrigerant flow path groove 32X is made to coincide with the outlet 32b of the refrigerant flow path 32. The metal bonding member 30C has preformed vertical through holes at positions corresponding to the inlet 32a and the outlet 32b. Then, the stack 50 is heated while being compressed under vertical pressure to allow the lower disc-shaped member 30B and the upper disc-shaped member 30A to be joined to form the cooling plate 30 (FIG. 3D). The refrigerant flow path groove 32X becomes the refrigerant flow path 32.

In the above-described wafer placement table 10 of this embodiment, the first variable section 34 is provided such that the cross-sectional area of the refrigerant flow path 32 gradually decreases as it proceeds in the direction of refrigerant flow from the starting point 34a of the first variable section 34. In the first variable section 34, the temperature of the refrigerant becomes lower toward the upstream side and higher toward the downstream side, and the velocity of the refrigerant becomes lower toward the upstream side and higher toward the downstream side. This reduces difference in heat extraction performance of the refrigerant between the upstream side and the downstream side of the first variable section 34. The second variable section 36 is provided such that, after the cross-sectional area of the refrigerant flow path 32 is once expanded in a first expansion section 35 right before the starting point 36a of the second variable section 36 from the cross-sectional area of the refrigerant flow path 32 at an end point 34b of the first variable section 34, the cross-sectional area of the refrigerant flow path 32 gradually decreases as it proceeds in the direction of refrigerant flow from the starting point 36a of the second variable section 36. The difference in heat extraction performance of the refrigerant between the upstream side and the downstream side of the second variable section 36 is small for the same reason as in the first variable section 34. In particular, in the second variable section 36, since the cross-sectional area of the refrigerant flow path 32 is once expanded right before the starting point 36a of the second variable section 36, the difference in cross-sectional area between the upstream side and the downstream side of the second variable section 36 can be made large with the pressure loss of the refrigerant flowing in the second variable section 36 being kept low. With this configuration, the wafer W can have higher heat uniformity.

The first expansion section 35 is shorter than the first variable section 34. With this configuration, the first variable section 34 can be long. Similarly, the second expansion section 37 is shorter than the second variable section 36. Thus, the second variable section 36 can be long.

Furthermore, the end point 34b of the first variable section 34 is located near the point where the first variable section 34 has made one round along the refrigerant flow path 32 from the starting point 34a of the first variable section 34. Thus, the amount of heat extraction by the refrigerant can be made substantially uniform in the refrigerant flow path 32 over almost the entire one round including the first variable section 34. Similarly, the end point 36b of the second variable section 36 is located near the point where the second variable section 36 has made one round along the refrigerant flow path 32 from the starting point 36a of the second variable section 36. Thus, the amount of heat extraction by the refrigerant in the refrigerant flow path 32 can be made substantially uniform over almost the entire one round including the second variable section 36.

Furthermore, the end point 34b of the first variable section 34 coincides with the starting point of the first expansion section 35. With this configuration, the end of the first variable section 34 can directly continue to the first expansion section 35. Similarly, the end point 36b of the second variable section 36 coincides with the starting point of the second expansion section 37. With this configuration, the end of the second variable section 36 can directly continue to the second expansion section 37.

Furthermore, the first expansion section 35 is a non-arc-shaped (here linear) section disposed during the circumferential portion of the swirl shape of the refrigerant flow path 32. In the non-arc-shaped section disposed during the circumferential portion of the refrigerant flow path 32, the velocity distribution of the refrigerant changes, and thus the cross-sectional area of the refrigerant flow path 32 can be increased in a relatively short distance by using this section. The same applies to the second expansion section 37.

Furthermore, the distance between the ceiling surface of the refrigerant flow path 32 and the wafer placement surface 20a is constant from the inlet 32a to the outlet 32b of the refrigerant flow path 32, and the cross-sectional area of the refrigerant flow path 32 is varied by varying the width of the refrigerant flow path 32 with the height in cross-section being kept constant. This enables the wafer placement table 10 to be relatively readily produced.

In addition, the refrigerant flow path 32 has the third variable section 38 located downstream of the second variable section 36. The third variable section 38 is provided such that, after the cross-sectional area of the refrigerant flow path 32 is once expanded from the cross-sectional area of the refrigerant flow path 32 at an end point 36b of the second variable section 36 in a second expansion section 37 right before the starting point 38a of the third variable section 38, the cross-sectional area of the refrigerant flow path 32 gradually decreases as it proceeds in the direction of refrigerant flow from the starting point 38a of the third variable section 38. In this way, the presence of the third variable section 38 can further improve the heat uniformity of the wafer W. The end point 38b of the third variable section 38 is located near the point where the third variable section 38 has made one round along the refrigerant flow path 32 from the starting point 38a of the third variable section 38. Thus, the amount of heat extraction by the refrigerant can be made substantially uniform in the refrigerant flow path 32 over almost the entire one round including the third variable section 38.

The present invention is not limited to the above-described embodiment, and can be carried out by various modes as long as they belong to the technical scope of the invention.

For example, in the above-described embodiment, the first, second, and third variable sections 34, 36, and 38 each extend almost the entire one round of the refrigerant flow path 32. However, this should not be construed as limiting, and configurations in FIGS. 4 and 5 may be employed.

Figure 4:
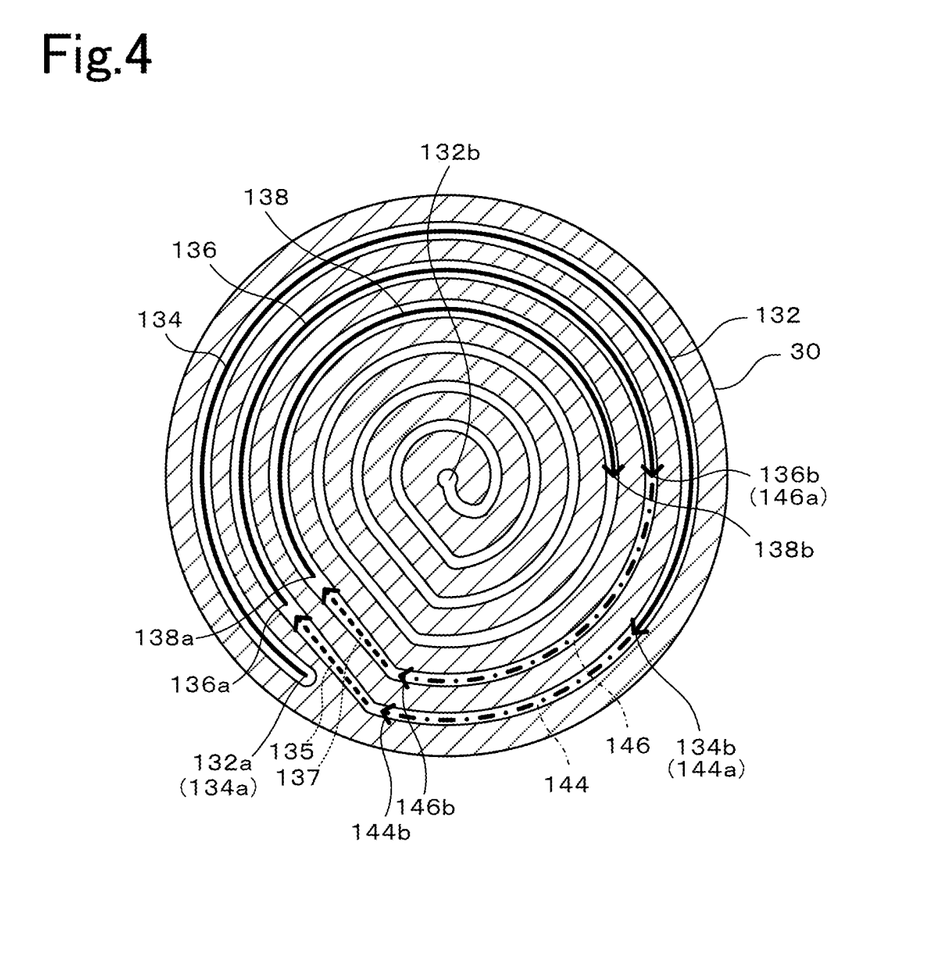
FIG. 4 is a plan view of a refrigerant flow path 132.

The refrigerant flow path 132 in FIG. 4 has, sequentially from an inlet 132a to an outlet 132b, a first variable section 134, a first constant section 144, a first expansion section 135, a second variable section 136, a second constant section 146, a second expansion section 137, and a third variable section 138. An end point 134b of the first variable section 134 is located near the point where the first variable section 134 has made ½ to ¾ round of the refrigerant flow path 132 from a starting point 134a (the inlet 132a of the refrigerant flow path 132) of the first variable section 134. The first variable section 134 has the same configuration as the first variable section 34 except for the length. The first expansion section 135 is located downstream of the first variable section 134, and the position, length, and configuration of the first expansion section 135 are the same as those of the first expansion section 35. The first constant section 144 is located between the end point 134b of the first variable section 134 and the starting point of the first expansion section 135. In the first constant section 144, the cross-sectional area of the refrigerant flow path 132 is constant from the starting point 144a to the end point 144b (here, the height and width of the refrigerant flow path 132 are constant in cross-section). The end point 136b of the second variable section 136 is located near the point where the second variable section 136 has made ½ to ¾ round of the refrigerant flow path 132 from the starting point 136a of the second variable section 136. The second variable section 136 has the same configuration as the second variable section 36 except for the length. The second expansion section 137 is located downstream of the second variable section 136, and the position, length, and configuration of the second expansion section 137 are the same as those of the second expansion section 37. The second constant section 146 is located between the end point 136b of the second variable section 136 and the starting point of the second expansion section 137. In the second constant section 146, the cross-sectional area of the refrigerant flow path 132 is constant from the starting point 146a to the end point 146b (here, the height and width of the refrigerant flow path 132 are constant in cross-section). The end point 138b of the third variable section 138 is located near the point where the third variable section 138 has made ½ to ¾ round of the refrigerant flow path 132 from the starting point 138a of the third variable section 138. The third variable section 138 has the same configuration as the third variable section 38 except for the length. The refrigerant flow path 132 has a constant cross-sectional area (constant height and width in cross-section) from the end point 138b of the third variable section 138 to the outlet 132b of the refrigerant flow path 132. The configuration illustrated in FIG. 4 can provide substantially the same effects as those of the above-described embodiment. However, the above-described embodiment, which does not have the first and second constant sections 144 and 146 of FIG. 4, can further improve the heat uniformity of the wafer W.

Figure 5:
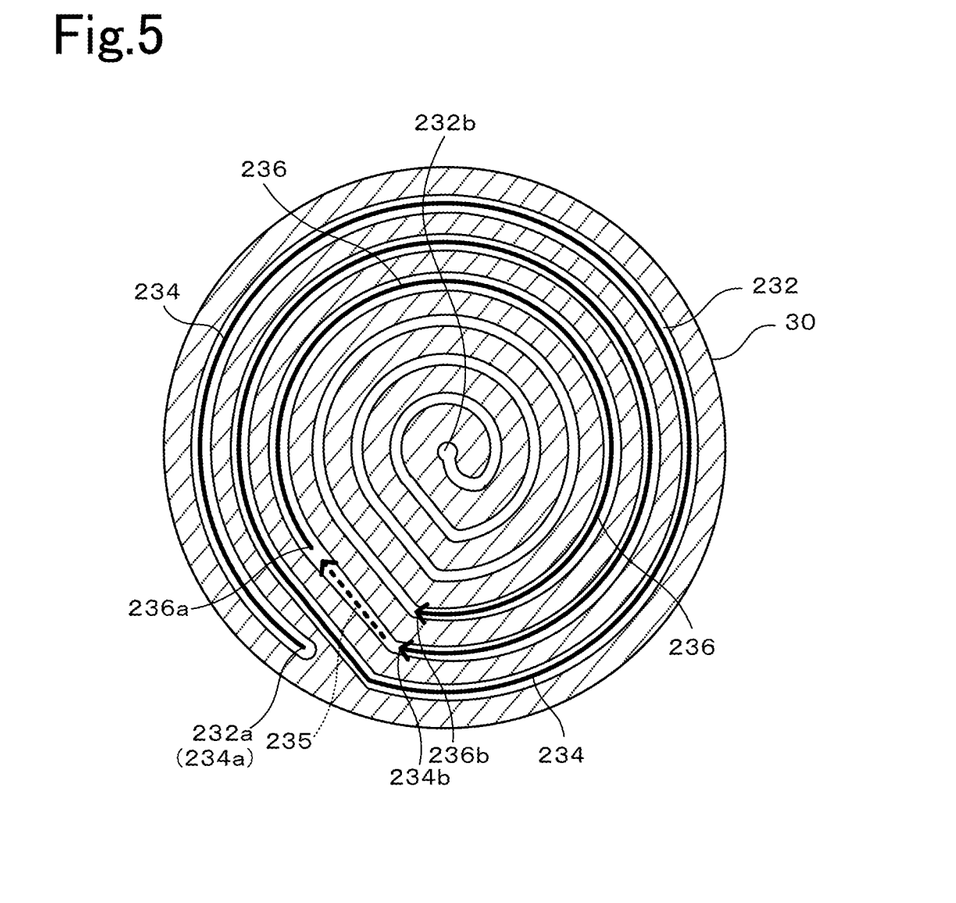
FIG. 5 is a plan view of a refrigerant flow path 232.

A refrigerant flow path 232 in FIG. 5 has, sequentially from an inlet 232a to an outlet 232b, a first variable section 234, a first expansion section 235, and a second variable section 236. An end point 234b of the first variable section 234 is located near the point where the first variable section 234 has made 2 round (e.g., it is located the point where the first variable section 234 has made 1.8 to 2.2 round) of the refrigerant flow path 232 from a starting point 234a of the first variable section 234 (the inlet 232a of the refrigerant flow path 232). The first variable section 234 has the same configuration as the first variable section 34 except for the length. The first expansion section 235 is located downstream of the first variable section 234, and the position, length, and configuration of the first expansion section 235 are the same as those of the second expansion section 37. The starting point of the first expansion section 235 coincides with the end point 234b of the first variable section 234, and the end point of the first expansion section 235 coincides with the starting point 236a of the second variable section 236. The end point 236b of the second variable section 236 is located near the point where the second variable section 236 has made 1 round (e.g., it is located at the point where the second variable section 236 has made 0.8 to 1.0 round) of the refrigerant flow path 132 from the starting point 236a of the second variable section 236. The second variable section 236 has the same configuration as the third variable section 38. The refrigerant flow path 232 has a constant cross-sectional area (constant height and width in cross-section) from the end point 236b of the second variable section 236b to the outlet 232b of the refrigerant flow path 232. The configuration illustrated in FIG. 5 can provide substantially the same effects as those of the above-described embodiment. However, the above-described embodiment, which has the first variable section 34, the first expansion section 35, and the second variable section 36 at the position of the first variable section 234 in FIG. 5, can further improve the heat uniformity of the wafer W.

Figure 6:
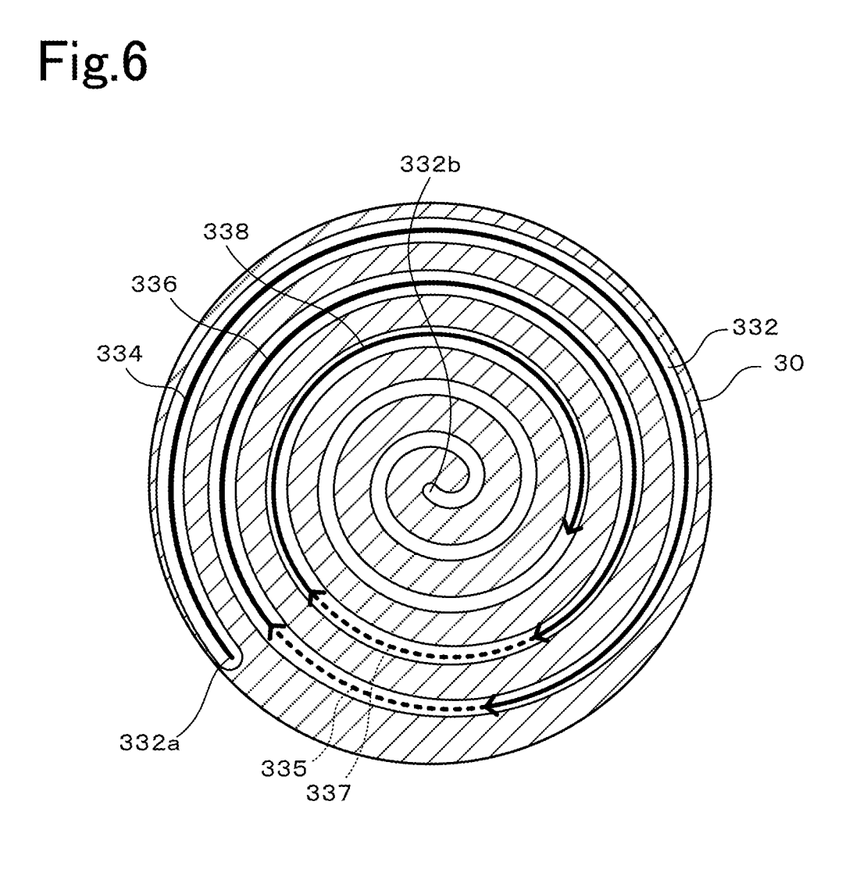
FIG. 6 is a plan view of a refrigerant flow path 332.

In the above-described embodiment, the first expansion section 35 and the second expansion section 37 are linear sections disposed in the way of the circumferential portion of the swirl shape of the refrigerant flow path 32. However, this should not be construed as limiting, and the configuration in FIG. 6 may be employed. In FIG. 6, a swirl refrigerant flow path 332 does not have a linear section and has, sequentially and continuously from an inlet 332a to an outlet 332b, an arc-shaped first variable section 334, an arc-shaped first expansion section 335, an arc-shaped second variable section 336, an arc-shaped second expansion section 337, and an arc-shaped third variable section 338. The first to third variable sections 334, 336, and 338 are substantially the same as the first to third variable sections 34, 36, and 38. The first and second expansion sections 335 and 337 are arc-shaped sections of the swirl refrigerant flow path 332, and thus the velocity distribution of the refrigerant in these sections are substantially uniform unlike in the linear first and second expansion sections 35 and 37. Thus, in the first and second expansion sections 335 and 337, the cross-sectional area of the refrigerant flow path 332 increases over a relatively long distance (e.g., about twice the distance of the first and second expansion sections 35 and 37). In an example, when the first and second expansion sections 35 and 37 have a length of 50 mm or less (e.g., 10 mm to 50 mm), the first and second expansion sections 335 and 337 may have a length of 100 mm or less to be longer than the length of the first and second expansion sections 35 and 37. The configuration illustrated in FIG. 6 can provide substantially the same effects as those of the above-described embodiment. However, the above-described embodiment, which has the first and second expansion sections 35 and 37 shorter than the first and second expansion sections 335 and 337, can have longer first to third variable sections 34, 36, and 38 and thus can further improve the heat uniformity of the wafer W.

In the above-described embodiment, the refrigerant flow path 32 has the second expansion section 37 and the third variable section 38, but the second expansion section 37 and the third variable section 38 may be eliminated. In such a configuration, the refrigerant flow path 32 still has the first variable section 34, the first expansion section 35, and the second variable section 36, and thus can improve the heat uniformity of the wafer W compared to the configuration that does not have these sections (the cross-sectional area of the refrigerant flow path 32 is constant from the inlet 32a to the outlet 32b).

In the above-described embodiment, the refrigerant flow path 32 has a constant height in cross-section throughout the refrigerant flow path 32, but the refrigerant flow path 32 may have a portion having a different height in cross-section. The refrigerant flow path 32 may have a different height in cross-section at a portion near the inlet 32a of the refrigerant flow path 32, or at a portion of the refrigerant flow path 32 that bypasses the power feeder connected to the electrostatic electrode 22. The refrigerant flow path 32 may have a different height in cross-section at a portion of the first variable section 34, a portion of the second variable section 36, a portion of the third variable section 38, a portion of the first expansion section 35, or a portion of the second expansion section 36. This also applies to the refrigerant flow path 132 in FIG. 4, the refrigerant flow path 232 in FIG. 5, and the refrigerant flow path 332 in FIG. 6. In FIG. 4, the refrigerant flow path 132 may have a different height in cross-section at a portion of the first constant section 144 or a portion of the second constant section 146.

In the above-described embodiment, one or more sets of the expansion section and the variable section may be provided downstream of the third variable section 38.

In the above-described embodiment, the wafer placement table 10 may have at least one of a heater electrode and an RF electrode (electrode for plasma generation) in the ceramic plate 20, instead of or in addition to the electrostatic electrode 22.

In the above-described embodiment, the cooling plate 30 has the inlet 32a of the refrigerant flow path 32 at the outer peripheral side and the outlet 32b of the refrigerant flow path 32 at the center side. However, this should not be construed as limiting. For example, the cooling plate 30 may have the inlet 32a of the refrigerant flow path 32 at the center side of the cooling plate 30 and the outlet 32b of the refrigerant flow path 32 at the outer peripheral side of the cooling plate 30.

In the above-described embodiment, the width of each of the first, second, and third variable sections 34, 36, and 38 in cross-section gradually changes from 8 mm to 6 mm. However, this should not be construed as limiting. For example, the first, second, and third variable sections 34, 36, and 38 may have different variation ranges of the width in cross-section. For example, the width of the first variable section 34 in cross-section may gradually change from 8 mm to 6 mm, and the width of the second and third variable sections 36 and 38 in cross-section may gradually change from 9 mm to 7 mm (or from 7 mm to 5 mm).

International Application No. PCT/JP2023/033244, filed on Sep. 12, 2023, is incorporated herein by reference in its entirety.

What is claimed is:

1. A wafer placement table comprising:
a ceramic plate having a wafer placement surface on its upper surface and including a built-in electrode;
a cooling plate disposed on a lower surface of the ceramic plate; and
a refrigerant flow path extending in the cooling plate, having an inlet located at one of an outer peripheral side and a center side of the cooling plate and an outlet located on the other of the outer peripheral side and the center side of the cooling plate, and extending from the inlet to the outlet in a swirl shape in plan view, wherein
the refrigerant flow path has a first variable section extending from the inlet as a starting point and a second variable section located downstream of the first variable section,
the first variable section is provided such that a cross-sectional area of the refrigerant flow path gradually decreases as it proceeds in the direction of refrigerant flow from the starting point of the first variable section, and
the second variable section is provided such that, after the cross-sectional area of the refrigerant flow path is once expanded from the cross-sectional area of the refrigerant flow path at an end point of the first variable section in a first expansion section right before the starting point of the second variable section, the cross-sectional area of the refrigerant flow path gradually decreases as it proceeds in the direction of refrigerant flow from the starting point of the second variable section.

2. The wafer placement table according to claim 1, wherein the first expansion section is shorter than the first variable section.

3. The wafer placement table according to claim 1, wherein the end point of the first variable section is located near the point where the first variable section has made one round along the refrigerant flow path from the starting point of the first variable section.

4. The wafer placement table according to claim 1, wherein the end point of the first variable section coincides with a starting point of the first expansion section.

5. The wafer placement table according to claim 1, wherein the first expansion section is a non-arc-shaped section disposed in the way of the circumferential portion of the swirl shape of the refrigerant flow path.

6. The wafer placement table according to claim 1, wherein a distance between a ceiling surface of the refrigerant flow path and the wafer placement surface is constant from the inlet to the outlet of the refrigerant flow path, and the cross-sectional area of the refrigerant flow path is varied by varying a width of the refrigerant flow path with a height of the refrigerant flow path in cross-section being kept constant.

7. The wafer placement table according to claim 1, wherein the refrigerant flow path has a third variable section located downstream of the second variable section, and
the third variable section is provided such that, after the cross-sectional area of the refrigerant flow path is once expanded from the cross-sectional area of the refrigerant flow path at an end point of the second variable section in a second expansion section right before the starting point of the third variable section, the cross-sectional area of the refrigerant flow path gradually decreases as it proceeds in the direction of refrigerant flow from the starting point of the third variable section.

* * * * *